United States Patent
Peltz et al.

(10) Patent No.: US 7,939,376 B2
(45) Date of Patent: May 10, 2011

(54) PATTERNED DIE ATTACH AND PACKAGING METHOD USING THE SAME

(75) Inventors: Leora Peltz, Pasadena, CA (US); Wayne Johnson, Dadeville, AL (US)

(73) Assignees: The Boeing Company, Chicago, IL (US); Auburn University, Auburn, AL (US)

( * ) Notice: Subject to any disclaimer, the term of this patent is extended or adjusted under 35 U.S.C. 154(b) by 0 days.

(21) Appl. No.: 12/851,699

(22) Filed: Aug. 6, 2010

(65) Prior Publication Data

US 2010/0291738 A1    Nov. 18, 2010

Related U.S. Application Data

(62) Division of application No. 11/758,810, filed on Jun. 6, 2007, now Pat. No. 7,786,602.

(51) Int. Cl.
*H01L 21/48* (2006.01)

(52) U.S. Cl. ........ 438/118; 438/106; 438/119; 438/122; 257/698; 257/701

(58) Field of Classification Search .......... 438/106–107, 438/118–127; 257/698–701, 785, 779–781
See application file for complete search history.

(56) References Cited

U.S. PATENT DOCUMENTS

| | | | |
|---|---|---|---|
| 5,585,671 | A | 12/1996 | Nagesh et al. |
| 5,621,615 | A | 4/1997 | Dawson et al. |
| 6,138,894 | A * | 10/2000 | Ulmer .................. 228/111.5 |
| 6,756,252 | B2 | 6/2004 | Nakanshi |
| 6,982,486 | B2 | 1/2006 | Brooks et al. |
| 7,183,650 | B2 * | 2/2007 | Shiono et al. .............. 257/758 |
| 7,420,273 | B2 | 9/2008 | Liu et al. |
| 7,498,196 | B2 | 3/2009 | Lee et al. |
| 2005/0001330 | A1 * | 1/2005 | Siegel et al. .............. 257/778 |
| 2005/0224955 | A1 | 10/2005 | Desai et al. |
| 2006/0137856 | A1 | 6/2006 | Popovich |
| 2007/0138650 | A1 * | 6/2007 | Ito et al. .................. 257/779 |
| 2010/0155964 | A1 * | 6/2010 | Katsurayama et al. ....... 257/777 |

* cited by examiner

*Primary Examiner* — Dung A. Le

(74) *Attorney, Agent, or Firm* — Ivan J. Mlachak; Brett L. Halperin

(57) ABSTRACT

A semiconductor die is attached to a packaging substrate by a patterned layer of conductive metal that includes voids. The voids provide a space into which the metal may expand when heated in order to avoid placing mechanical stress on the bonds caused by mismatches in the thermal coefficients of thermal expansion of the die, the conductive metal bond layer and the substrate. An additional coating of conductive metal may be flowed over the bond lines to reinforce the bonds.

19 Claims, 5 Drawing Sheets

PATTERNED DIE ATTACH AND PACKAGING METHOD USING THE SAME

This application is a divisional of application Ser. No. 11/758,810, filed Jun. 6, 2007, now issued as U.S. Pat. No. 7,786,602.

BACKGROUND INFORMATION

1. Field

This disclosure generally relates to semiconductor devices and processes, and deals more particularly with a patterned die attach layer and a related method of packaging a semiconductor die using the attach layer.

2. Background

Integrated circuits and discrete components are formed on wafers that are sawed into individual chips often referred to as dies. The dies are mounted in sealed packages having standard pin arrays that connect the die to a larger circuit. One or more of the dies may be bonded on a package substrate, referred to as a chip carrier, using a layer of conductive material known as a "die attach layer".

The die attach process can materially affect both the performance and reliability of the packaged semiconductor component. The die, the substrate and the die attach layer are normally formed from materials that have different thermal coefficients of expansion (TCE). Mismatches in the TCE of the die, substrate and attach layer may cause mechanical stresses on the bond, especially in those applications involving high-power semiconductor components where higher current flows produce higher levels of heat, or in applications where performance is required over a wide range of temperatures. These mechanical stresses may cause cracks and/or delaminations between the die, attach layer and substrate, resulting in device detachment or die cracking.

In order to reduce the problems caused by mismatch of the TCEs, customized alloys have been formulated for use as the die attach layer in order to better match the TCE between the die and the die attach, as well as between the die attach and the chip carrier package. This metallurgical solution is not entirely satisfactory for at least two reasons. First, the TCE of the die and the package substrate change with temperature, often nonlinearly, in a manner that is specific to each element (the die or the package substrate). Further, the customized TCE of the specially formulated die attach layer also changes with temperature in a manner different from either the die or package substrate. Accordingly, it may not be practical to match the TCEs of the elements using a single alloy. The selection of a suitable alloy for use as the die attach is made more challenging by the fact that it is necessary to limit the selection of an alloy to those that have working temperatures in a range that will not result in damage to the die. Die attach materials with high working temperatures may require processes that diminish die reliability, or damage the die, particularly the sensitive upper oxide layer on the die.

Second, the die and the package substrate require surface metallization layers that adhere strongly to the semiconductor die, and the package substrate, which is typically ceramic. High operating temperatures may cause the die attach layer to interdiffuse with these surface metallization layers. This natural diffusion process effectively mixes the interfacial materials, thereby changing the composition of the customized die attach alloy, as well as its thermal and mechanical properties.

Accordingly, there is a need for a die attach that reduces or eliminates the need for specialized metal alloys and overcomes the problems associated with interfacial diffusion of the materials. The disclosed embodiments are intended to satisfy this need.

SUMMARY

The problems resulting from TCE mismatch are reduced or eliminated through the use of geometric, rather than metallurgical techniques. In contrast to previous die attach methods employing a continuous alloy layer to bond the die to the substrate, embodiments of the disclosure use patterned shapes for the die attach layer that include openings or voids into which the die attach materials may expand, thereby avoiding mechanical stress on the bonds between the die and the substrate.

According to one embodiment of the disclosure, a die attach for bonding a semiconductor die to a package substrate is provided. The die attach comprises a layer of conductive material that bonds the die to the substrate, wherein the layer includes a plurality of voids providing space into which portions of the conductive material may thermally expand. The voids may form a repeating geometric pattern or an irregular pattern over the die attach layer. A conductive coating may cover at least portions of the die attach layer for reinforcing the bond between the die and the substrate.

According to another embodiment, a die attach is provided for attaching a semiconductor die to a die package substrate. The die attach comprises a patterned first layer of conductive metal bonding the die to the die package substrate, and a second layer of conductive metal covering the bond seams for reinforcing the bond between the die and the package. The patterned first layer may include openings therein which allow material in the first layer to expand without accumulating mechanical stress. The patterned first layer may be a metal such as gold, or a gold-tin alloy. The patterned first layer may be formed from any of a variety of geometric layouts, including strips, grooves and individual regular or irregular islands of material.

According to another embodiment, a method is provided of packaging a semiconductor die, comprising the steps of forming a patterned layer of conductive material having voids therein and, attaching the die to a package substrate using the patterned layer. The patterned layer may be formed either on the die or the substrate. Alternatively, the patterned layer may be produced as a preform that is interposed between the die and the substrate during the bonding process. The method may further include the step of flowing a metal plating solution over bond lines between the patterned layer and the substrate which creates a reinforcing layer over the bond lines. A micropipette may be used to flow the conductive metal plating solution over the bond lines.

Other features, benefits and advantages of the disclosed embodiments will become apparent from the following description of embodiments, when viewed in accordance with the attached drawings and appended claims.

DETAILED DESCRIPTION

Figure 1:
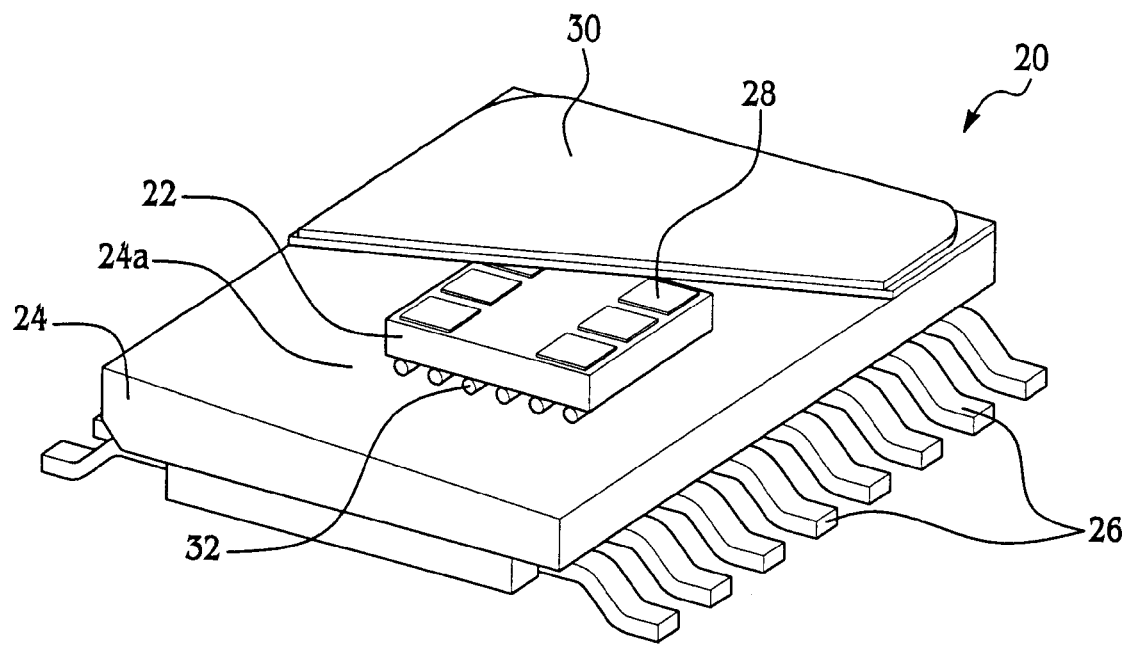
FIG. 1 is a perspective illustration of a packaged semiconductor die, the bond wires and a portion of a cover having been removed for purposes of clarity.
Figure 2:
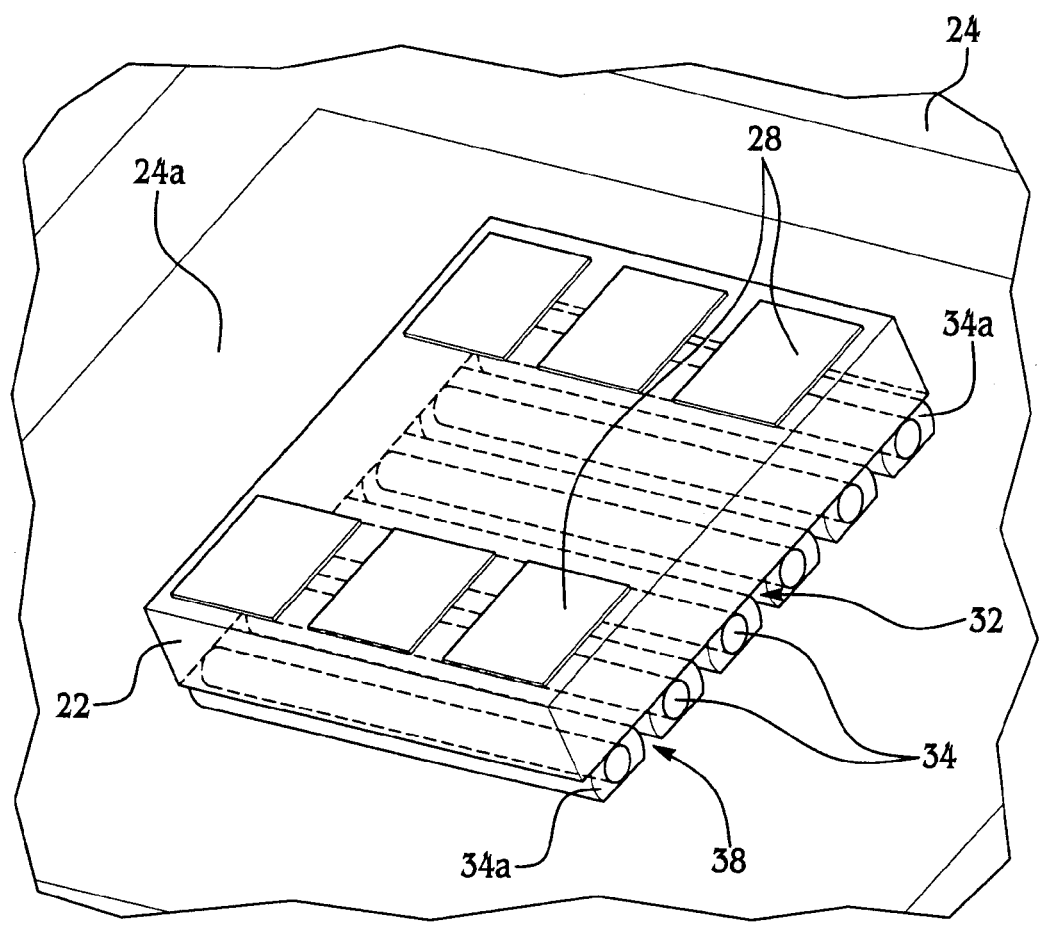
FIG. 2 is an enlarged, perspective illustration of the die shown in FIG. 1, better depicting one form of a patterned die attach layer.
Figure 3:
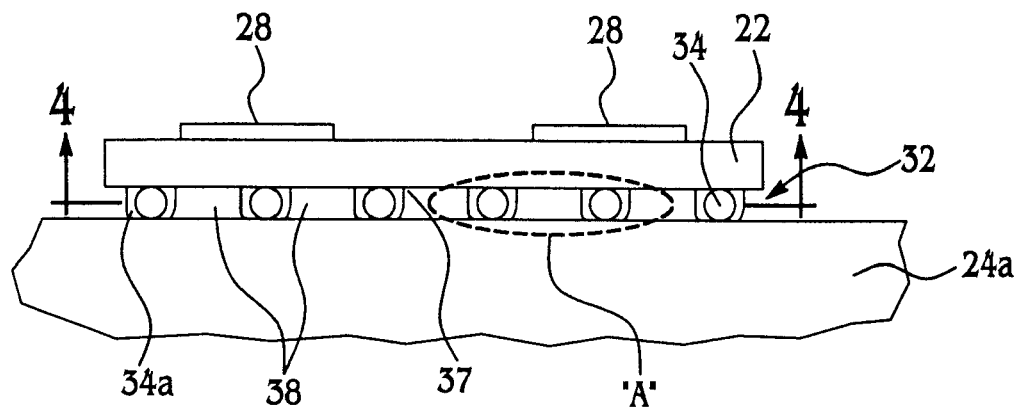
FIG. 3 is a cross section illustration of the die shown in FIGS. 1 and 2.
Figure 4:
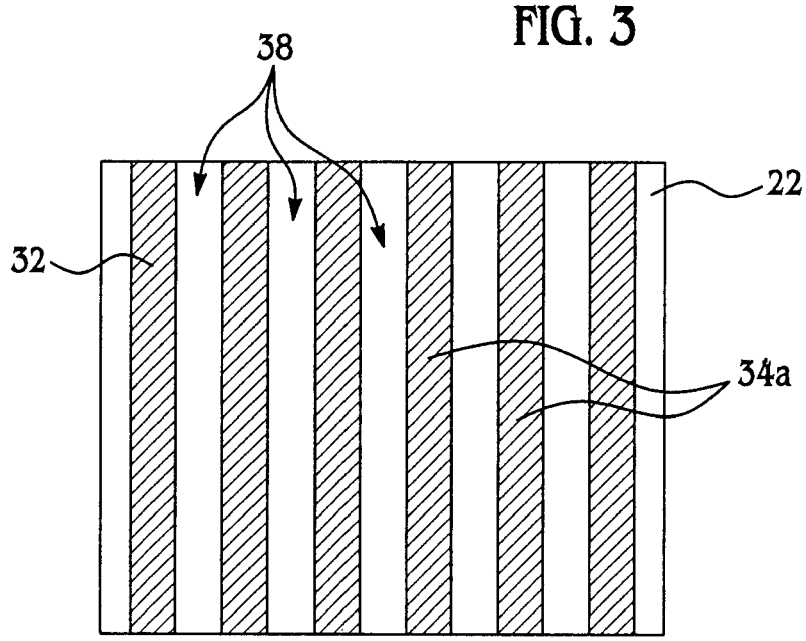
FIG. 4 is a sectional illustration taken along the line 4-4 in FIG. 3.

Referring first to FIGS. 1-5, a semiconductor device 20, which may be an integrated circuit for example, broadly comprises a semiconductor die 22 packaged in a carrier 24 that is enclosed by a cover 30. The carrier 24 may comprise any of various well known materials including ceramic, glass/ceramic or metal. The cover 30 is typically formed of a ceramic or metal material and may be hermetically sealed on the carrier 24. The carrier 24 may include a lead frame (not shown) having pins 26 for attaching the device 20 to a larger circuit. The semiconductor die 22 includes bonding pads 28 on the upper surface thereof. Wires (not shown) are used to connect the bonding pads 28 to the pins 26. The carrier 24 includes a substrate 24a having a central portion defining a die attach area to which the die 22 is attached using a patterned attach layer 32.

As will be discussed in more detail below, the patterned die attach layer 32 may comprise a pattern of conductive material, which may be a relatively simple metal or metal alloy such as a gold-tin eutectic alloy that contains a series of voids or openings therein which effectively provide the attach layer 32 with some degree of elasticity. This elasticity allows the material in the attach layer 32 to expand without placing large stresses on the bonds with the die 22 and the substrate 24a.

As used herein, the terms "attach layer" or "patterned layer" are intend to include continuous or discontinuous material in any of a variety of shapes and patterns, without limitation, forming a bond between the die 22 and the die attach area. The attach layer 32 may comprise individual sections of material that may or may not be connected to each other. For example, the attach layer 32 may comprise a plurality of separate islands of material each of which forms an attachment bond between the die 22 and the substrate 24a. The open areas between the islands form spaces into which the material may expand at elevated temperatures due to thermal expansion of the material. Alternatively, the attach layer 24a may comprise a plurality of connected islands. Additionally, the attach layer 32 may comprise a continuous layer of material that includes interspersed partial voids or partial open areas that provide an expansion area. These partial voids or partial openings may extend a partial distance of the height of the layer 32, or the full height of the layer 32. The pattern of voids or openings may be geometrically regular or irregular.

As will be discussed below in connection with FIG. 13, the processing methods used to form the patterned die attach layer 32 will depend in part on the on geometry, thickness and type of material used for the attach layer 32. For example, the patterned layer 32 may be formed on the surface of either the die 22 or the substrate 24a. Alternatively, the patterned layer 32 may be produced as a preform that is simultaneously attached to the die 22 and the substrate 24a.

In the embodiment shown in FIGS. 1-5, the attach layer 32 comprises a plurality of conductive metal wires 34 arranged in spaced apart, parallel relationship that define rectangular openings 38 extending the full height of the attach layer 32. During the attach process, which will be described below, the round wires 34 are heated, with or without the application of ultrasonic energy, to the cold flow temperature of the material forming the metal wires 34. As used herein, "cold flow temperature" means the temperature at which a metal flows under the application of pressure, but below the melting point of the metal. Heating the round metal wires 34 while applying pressure thereto either through the substrate 24a or the die 22, deforms the wires, producing individual attach elements 34a that are generally rectangular in cross section. The number of attach elements 34a, and the spacing of the openings 38 will depend upon the particular application. Generally, however, the bond strength of the attach layer 32 increases as the total bond area of the attach elements 34a increases. Accordingly, the total area of the attach elements 34a should be as large as possible while maintaining open areas 38 that are large enough to accommodate lateral expansion of the attach elements 34a without producing induced mechanical stress on the bonds with the die 22 and substrate 24a.

Figure 5:
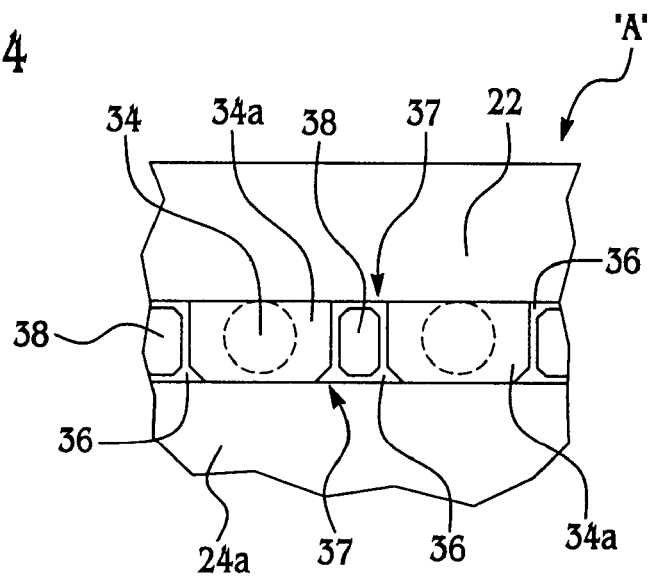
FIG. 5 is an enlarged illustration of the area designated as "A" in FIG. 3.

As shown in FIG. 5, a second layer 36 of conductive metal covers the sides of the attach layer elements 34a and extends over the bond lines 37 between the attach layer 32 and the die 22 and substrate 24a. The layer 36 of conductive material may be relatively thin, on the order of 5 μm to 100 μm, although other thicknesses may be possible, depending on the application. Layer 36 may be formed by applying a plating solution comprising gold, silver, tin, silicon, germanium, indium, or alloys of these and other materials. The second layer 36 strengthens the bond provided by the attach elements 34a by filling small voids that may be present along the bond line 37.

Figure 6:
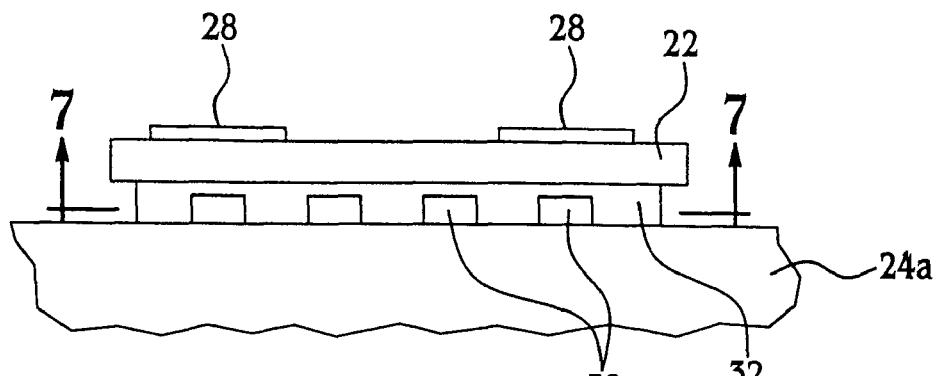
FIG. 6 is an illustration similar to FIG. 3 but showing an alternate form of the die attach layer.
Figure 7:
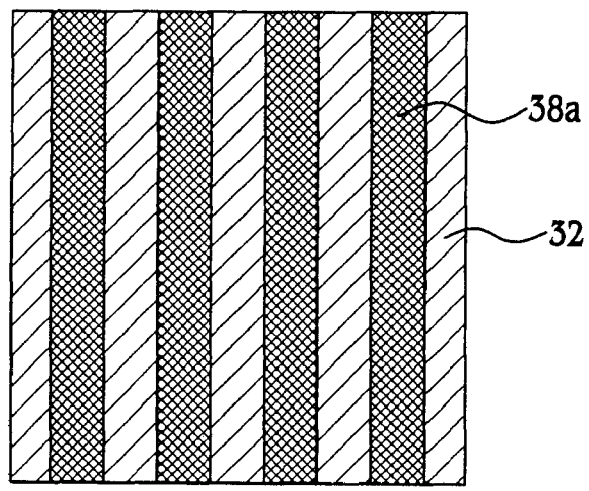
FIG. 7 is a sectional illustration taken along the line 7-7 in FIG. 6.

Referring to FIGS. 6 and 7, the openings or voids in the attach layer 32 may comprise grooves 38a in a continuous layer of material. Thus, while the openings 38 (FIG. 3) in the embodiment shown in FIGS. 1-5 extend the full height of the attached layer 32, the grooves 38a extend only partially through the attach layer 32. While the grooves 38a are shown on the bottom side of the attach layer 32, they may be also formed in the top side of the attach layer 32, or on both the top and bottom sides of attach layer 32.

Figure 8:
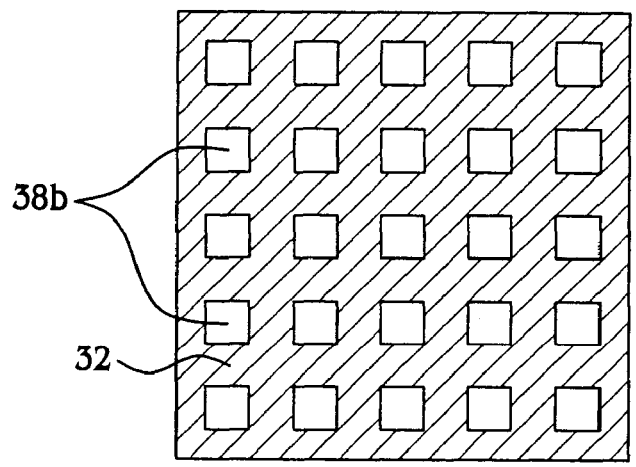
FIG. 8 is a plan illustration of a die attach layer having a regular pattern of voids.

An alternate embodiment of the attach layer 32 is illustrated in FIG. 8 in which a regular grid of rectangular openings 38b are formed in the attach layer 32. The openings 38b may be other shapes such as circles or ovals, and may or may not extend through the entire thickness of the attach layer 32.

Figure 9:
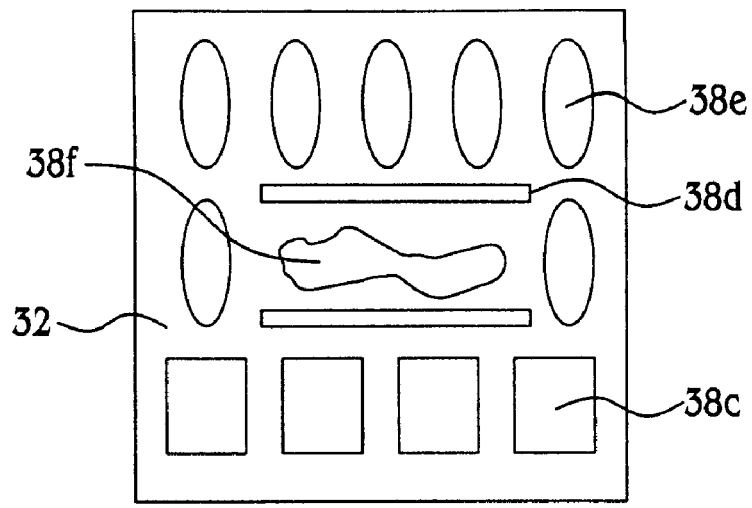
FIG. 9 is a plan illustration of a die attach layer having an irregular pattern of voids.

FIG. 9 illustrates another embodiment of the attach layer 32 having an irregular pattern of openings 38 of various geometric shapes which are merely exemplary of a wide variety of shapes that may be employed, depending on the particular application. For example, the pattern may include square openings 38c, rectangular openings 38d, oval openings 38e, or irregularly shaped openings 38f.

Figure 10:
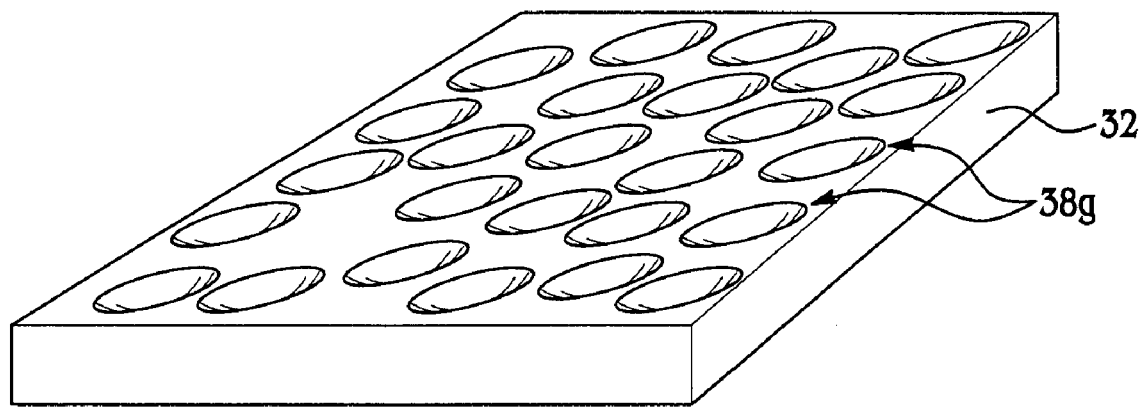
FIG. 10 is a perspective illustration of a die attach layer having an irregular pattern of partial voids in one side thereof.
Figure 11:
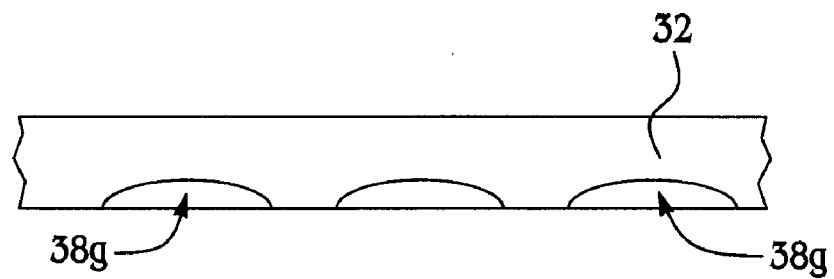
FIG. 11 is a sectional illustration of a portion of the die attach layer shown in FIG. 10.

FIGS. 10 and 11 illustrate a further embodiment of the attach layer 32 in which an irregular pattern of openings in the form of depressions 38g are formed in the bottom face of the attach layer 32. Alternatively, the depressions 38g may be laid out in a regular, repeating geometric pattern. The depressions 38g are sized to allow sufficient expansion of the adjacent material in the attach layer 32, and may be formed in the top side of the attach layer 32, or both the top and bottom sides of the attach layer 32.

Figure 12:
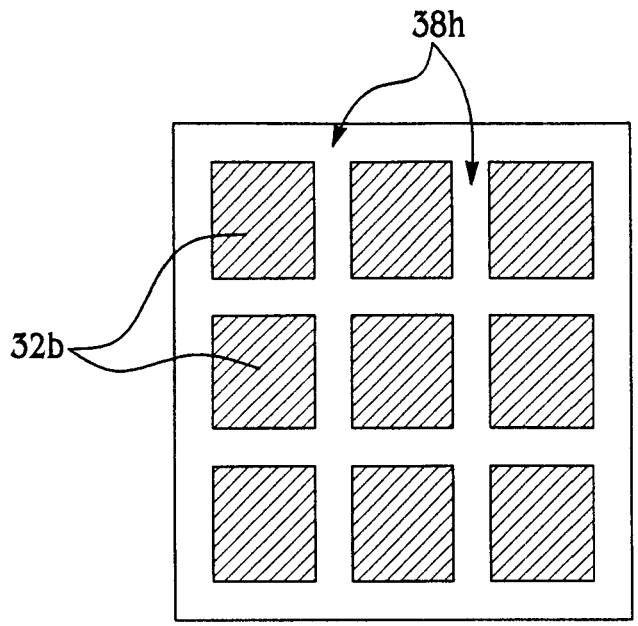
FIG. 12 is a plan illustration of an alternate form of a die attach layer formed by separate islands of material.

As shown in FIG. 12, the attach layer 32 may comprise a plurality of individual islands 32b of conductive materials which are separated by spaces 38h that allow expansion of the islands 32b on all sides thereof.

Figure 13:
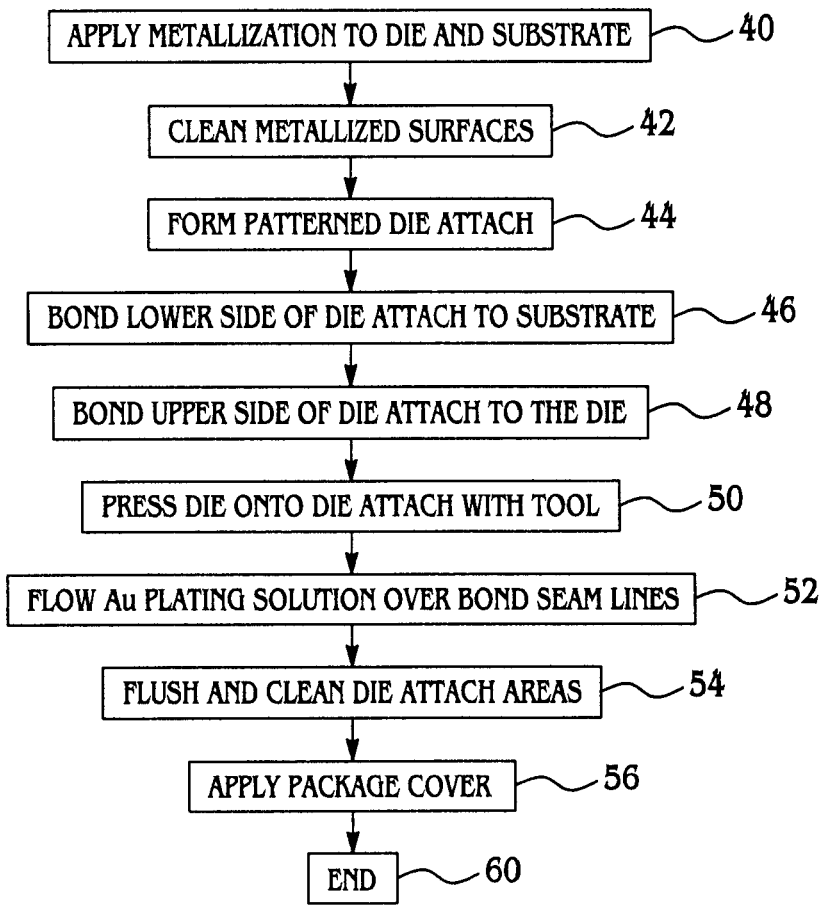
FIG. 13 is a simplified flow diagram illustrating the process for packaging a die using a patterned die attach layer.

Attention is now directed to FIG. 13 which illustrates the broad steps that may be used in packaging a semiconductor device using a patterned attach layer according to the disclosed embodiments. Normally, the surfaces on the die 22 and the die attach area on the carrier 24 are metallized when they are initially fabricated. However, depending on the application and the particular assembly process to be used, it may be desirable to apply additional metallization to these areas. Accordingly, as shown at step 40, a layer of metallization comprising for example, gold or a gold alloy may optionally be applied to the interior surface of the carrier 24 and the underside of the die 22 using plating techniques. Then, optionally, at step 42, the metallized surfaces may be cleaned to remove surface contaminants and particles, using either wet cleaning or dry cleaning techniques which are well known.

As previously discussed, the patterned die attach layer 32 may be applied using any of a variety of techniques, depending on the particular application. Thus, for example, at step 44, the patterned die attach layer 32 may be formed and applied to either the substrate 24a or one side of the die 22. The process for laying out the patterned die attach layer 32 of the substrate 24a will depend upon the geometry of the pattern, the desired bond strength and various other factors that relate to the particular application. In the case of the embodiment illustrated in FIGS. 1-5, the gold or gold alloy wires 34 may be placed on the substrate 24a in the desired spaced apart pattern. Alternatively, strips of gold film (not shown) may be laid out in patterns on the substrate 24a to achieve the pattern geometry illustrated in FIGS. 1-5.

The patterned attach layer 32 may also be formed using conventional processes for fabricating semiconductor devices, including the use of metal plating, photoresists and chemical etching; in this case, the patterned attached layer 32 may be formed directly on the die 22 when it is fabricated as part of the wafer from which it is eventually cut. Further, the die attach layer 32 may be produced as a preform that is bonded to the carrier 24 and the die substantially at the same time. The die attach layer 32 may also be produced using a variety of other methods well known in the art of semiconductor processing. The particular metal used to form the patterned attach layer 32 will depend upon the application, however relatively simple metals and metal alloys are contemplated, including, without limitation, gold, gold-tin alloys, silver and other metals.

In one embodiment in which the attach layer 32 is first attached to the substrate 24a, at step 46, the lower side of the die attach layer 32 may be bonded to the substrate 24a by placing the carrier 24 on a hot plate, or in an oven where the carrier and the die attach layer 32 are heated to the cold flow temperature of the conductive material forming the die attach layer 32, thereby creating an attachment bond. Bonding of the lower side of the die attach layer 32 to the substrate 24a may be performed at elevated temperatures, using heat that is applied from the bottom of the carrier 24, as through the hot plate mentioned above.

Next, at step 48, the upper side of the die attach layer 32 may be bonded to the bottom side of the die 22. Bonding of the upper side of the die attach layer 32 to the metallized underside of the die 22 is performed by local reheating, such as maybe carried out using a hot plate, with or without focused ultrasonic energy. Generally, the die 22 may be subject to damage if heated above a certain temperature so care is taken in the technique used in step 48 not to heat the die 22 above a temperature which could cause damage to the die 22. During, or immediately after step 48 is performed, a tool (not shown) may be used to press the die 22 onto the die attach layer 32, as shown at 50. The pressing performed in step 50 helps assure that good contact is achieved over the bonding area between the die attach layer 32 and the die 22.

Steps 46-50 may include a number of variations, depending on whether the attach layer 32 is being bonded first to the die 22 or the substrate 24a, or whether the attach layer 32 is a preform, in which case the attach layer 32 is bonded to the die 22 and the substrate 24a at substantially the same time.

Depending on the particular application, in some cases small voids or crevices may be present along the bond lines 37 (FIGS. 3 and 5) between the die attach layer 32 and both the die 22 and the substrate 24a. Optionally, in these cases, in order to increase the bond strength, a plating solution of conductive metal such as gold may be flowed into the openings 38 so as to cover the bond lines 37, and improve the overall bonding. The introduction of the conductive metal at optional step 52 may be achieved using any of a variety of wet chemistry processing techniques, such as using micropipettes used to perform micro-injection of the liquid metal, or electroplating from fluid solutions of the metal.

Next, at step 54, the areas of the die attach layer 32 including the bond lines 37 are flushed and cleaned to remove chemical residues, using a flow of cleaning solution. At step 56, the cover 30 is applied to the carrier 24 in order to hermetically seal the die 22, ending the process at step 60.

It should be noted here that other processes can be used to carry out the metal coating described in step 52 such as using biological entities to create patterns of inorganic materials to deposit the conductive metal over the bond lines 37.

As an alternative to the use of micropipettes, MEMS microfluidic devices may be used to introduce a flow of liquid metal into the openings 38 so as to cover the bond lines 37. Depending upon the geometry of the patterned die attach layer 32 pressure may be applied to force the liquid metal through the capillaries formed by the openings or voids in the patterned layer 32.

Although the embodiments of this disclosure have been described with respect to certain exemplary embodiments, it is to be understood that the specific embodiments are for purposes of illustration and not limitation, as other variations will occur to those of skill in the art.

What is claimed is:

1. A method of packaging a semiconductor die, comprising the steps of:

forming a patterned layer of conductive material having voids therein by placing strips of conductive metal on a substrate; and, attaching the die to a package substrate using the patterned layer formed.

2. The method of claim 1, wherein the step of attaching the die to the package substrate using the patterned layer formed comprises:

bonding the patterned layer to the substrate.

3. The method of claim 2, wherein the step of attaching the die to the package substrate using the patterned layer formed comprises:

placing the die on the patterned layer after the patterned layer has been bonded to the substrate.

4. The method of claim 3, wherein the step of attaching the die to the package substrate using the patterned layer formed comprises:
   bonding the patterned layer to the die.

5. The method of claim 1, wherein the step of attaching the die to the package substrate using the patterned layer formed is performed by heating the patterned layer to a cold flow temperature of the conductive material.

6. The method of claim 5, wherein the heating is performed using ultrasonic energy.

7. The method of claim 1, wherein the step of attaching the die to the package substrate using the patterned layer formed comprises:
   compressing the die and the substrate.

8. The method of claim 1 further comprising:
   flowing a conductive metal solution over bond lines between the patterned layer and the substrate to reinforce the bonds between the patterned layer, the die and the substrate.

9. The method of claim 8, wherein the step of flowing the conductive metal solution over the bond lines between the patterned layer and the substrate to reinforce the bonds between the patterned layer, the die, and the substrate is performed using a micropipette.

10. The method of claim 1, wherein the step of forming the patterned layer of the conductive material having the voids therein comprises:
    producing a perform; and
wherein the step of attaching the die to the package substrate using the patterned layer formed comprises:
    interposing the preform between the die and the substrate.

11. The method of claim 1 wherein the voids form a repeating geometric pattern across the patterned layer of conductive material.

12. The method of claim 1 wherein the voids form an irregular pattern across the patterned layer of conductive material.

13. The method of claim 1 wherein the patterned layer of conductive material comprises a material selected from the group consisting of gold, silver, tin, silicon, germanium, indium, and alloys thereof.

14. The method of claim 1 wherein the voids form a groove.

15. A method of packaging a semiconductor die, comprising the steps of:
    forming a patterned layer of conductive material having voids therein by placing strips of conductive metal on a substrate;
    attaching the die to a package substrate using the patterned layer formed; and
    flowing a conductive metal solution over bond lines between the patterned layer and the substrate to reinforce the bonds between the patterned layer, the die and the substrate,
wherein the step of flowing the conductive metal solution over the bond lines between the patterned layer and the substrate to reinforce the bonds between the patterned layer, the die, and the substrate is performed using a micropipette.

16. The method of claim 15, wherein the step of attaching the die to the package substrate using the patterned layer formed further comprises compressing the die and the substrate.

17. The method of claim 15, wherein the step of attaching the die to the package substrate using the patterned layer formed is performed by heating the patterned layer to a cold flow temperature of the conductive material.

18. The method of claim 17, wherein the heating is performed using ultrasonic energy.

19. The method of claim 15, wherein the step of forming the patterned layer of the conductive material having the voids therein comprises:
    producing a preform; and
wherein the step of attaching the die to the package substrate using the patterned layer formed comprises:
    interposing the preform between the die and the substrate.

* * * * *